(12) United States Patent
Forbes et al.

(10) Patent No.: US 7,339,228 B2
(45) Date of Patent: Mar. 4, 2008

(54) NON-PLANAR FLASH MEMORY ARRAY WITH SHIELDED FLOATING GATES ON SILICON MESAS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 59 days.

(21) Appl. No.: 11/363,730

(22) Filed: Feb. 28, 2006

(65) Prior Publication Data

US 2006/0145241 A1 Jul. 6, 2006

Related U.S. Application Data

(62) Division of application No. 10/916,354, filed on Aug. 11, 2004.

(51) Int. Cl.
*H01L 29/788* (2006.01)
(52) U.S. Cl. ............ 257/315; 257/316; 438/201; 438/243; 438/259; 438/270
(58) Field of Classification Search .......... 257/315, 257/316; 438/201, 243, 259, 270
See application file for complete search history.

(56) References Cited

U.S. PATENT DOCUMENTS

| | | | |
|---|---|---|---|
| 5,352,621 A * | 10/1994 | Kim et al. | 438/253 |
| 5,502,321 A | 3/1996 | Matsushita | |
| 5,652,447 A * | 7/1997 | Chen et al. | 257/315 |
| 5,677,871 A * | 10/1997 | Pio et al. | 365/185.11 |
| 5,867,429 A | 2/1999 | Chen | |
| 5,891,777 A * | 4/1999 | Chang | 438/275 |
| 6,028,342 A * | 2/2000 | Chang | 257/390 |
| 6,030,868 A * | 2/2000 | Early et al. | 438/257 |
| 6,143,636 A | 11/2000 | Forbes | |
| 6,157,060 A | 12/2000 | Kerber | |
| 6,211,547 B1 * | 4/2001 | Kao et al. | 257/317 |
| 6,282,123 B1 * | 8/2001 | Mehta | 365/185.28 |
| 6,455,888 B1 * | 9/2002 | Early et al. | 257/315 |
| 6,689,644 B2 | 2/2004 | Johnson | |
| 6,713,834 B2 * | 3/2004 | Mori et al. | 257/510 |
| 6,744,094 B2 | 6/2004 | Forbes | |
| 6,780,683 B2 | 8/2004 | Johnson | |

(Continued)

OTHER PUBLICATIONS

J.-D. Lee, S.-H. Hur, and J.-D. Choi, "Effects of Floating-Gate Interference on NAND Flash Memory Cell Operation," IEEE Electron Device Letters, vol. 23, No. 5, May 2002, pp. 264-266.

(Continued)

*Primary Examiner*—Steven Loke
*Assistant Examiner*—Tram H Nguyen
(74) *Attorney, Agent, or Firm*—Leffert Jay & Polglaze, P.A.

(57) ABSTRACT

A first plane of memory cells is formed on mesas of the array. A second plane of memory cells is formed in valleys adjacent to the mesas. The second plurality of memory cells is coupled to the first plurality of memory cells through a series connection of their source/drain regions. Wordlines couple rows of memory cells of the array. Metal shields are formed between adjacent wordlines and substantially parallel to the wordlines to shield the floating gates of adjacent cells.

15 Claims, 6 Drawing Sheets

U.S. PATENT DOCUMENTS

| | | | |
|---|---|---|---|
| 7,164,168 B2* | 1/2007 | Forbes et al. | 257/315 |
| 7,170,786 B2* | 1/2007 | Chien et al. | 365/185.17 |
| 2002/0167043 A1* | 11/2002 | Hashimoto | 257/316 |
| 2003/0193064 A1* | 10/2003 | Wu | 257/315 |
| 2004/0012998 A1 | 1/2004 | Chien | |
| 2005/0212033 A1 | 9/2005 | Forbes | |

OTHER PUBLICATIONS

P. Paven, et al., "Flash Memories-An Overview," Proc. IEEE, vol. 85, No. 8, Aug. 1997, pp. 1248-1271.

D.-C. Kim et al., "A 2Gb NAND Flash Memory with 0.044 μm Cell Size using 90nm Flash Technology," IEEE IEDM, San Francisco, 2002, pp. 919-922.

J.-D. Choi et al., "Highly Manufacturable 1 Gb NAND Flash Using 0.12 μm Process Technology," IEEE IDEM, Washington, D.C., 2001, pp. 25-28.

S. Wolf and R.N. Tauber, "Silicon Processing for the VLSI Era," Lattice Press, Sunset Beach, CA, vol. 1, 1986, pp. 531-532.

G. Xue, et al., "Low Voltage Low Cost Nitride Embedded Flash Memory Cell,"IMEC, Kapeldreef 75, B3001 Leuven Belgium, 19th IEEE Non-Volatile Semiconductor Memory Workshop, Monterey, CA, Feb. 16, 2003, pp. 62-64.

* cited by examiner

NON-PLANAR FLASH MEMORY ARRAY WITH SHIELDED FLOATING GATES ON SILICON MESAS

RELATED APPLICATION

This Application is a Divisional of U.S. application Ser. No. 10/916,354 titled "NON-PLANAR FLASH MEMORY ARRAY WITH SHIELDED FLOATING GATES ON SILICON MESAS," filed Aug. 11, 2004, (pending) which is commonly assigned and incorporated herein by reference.

TECHNICAL FIELD OF THE INVENTION

The present invention relates generally to memory devices and in particular the present invention relates to a flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Stray capacitance in flash memory cells can cause problems. For example, the capacitance between different floating gates that are close together can cause coupling and cross-talk between the floating gates of neighboring cells. This may also have the effect of reducing memory cell performance.

Figure 1:
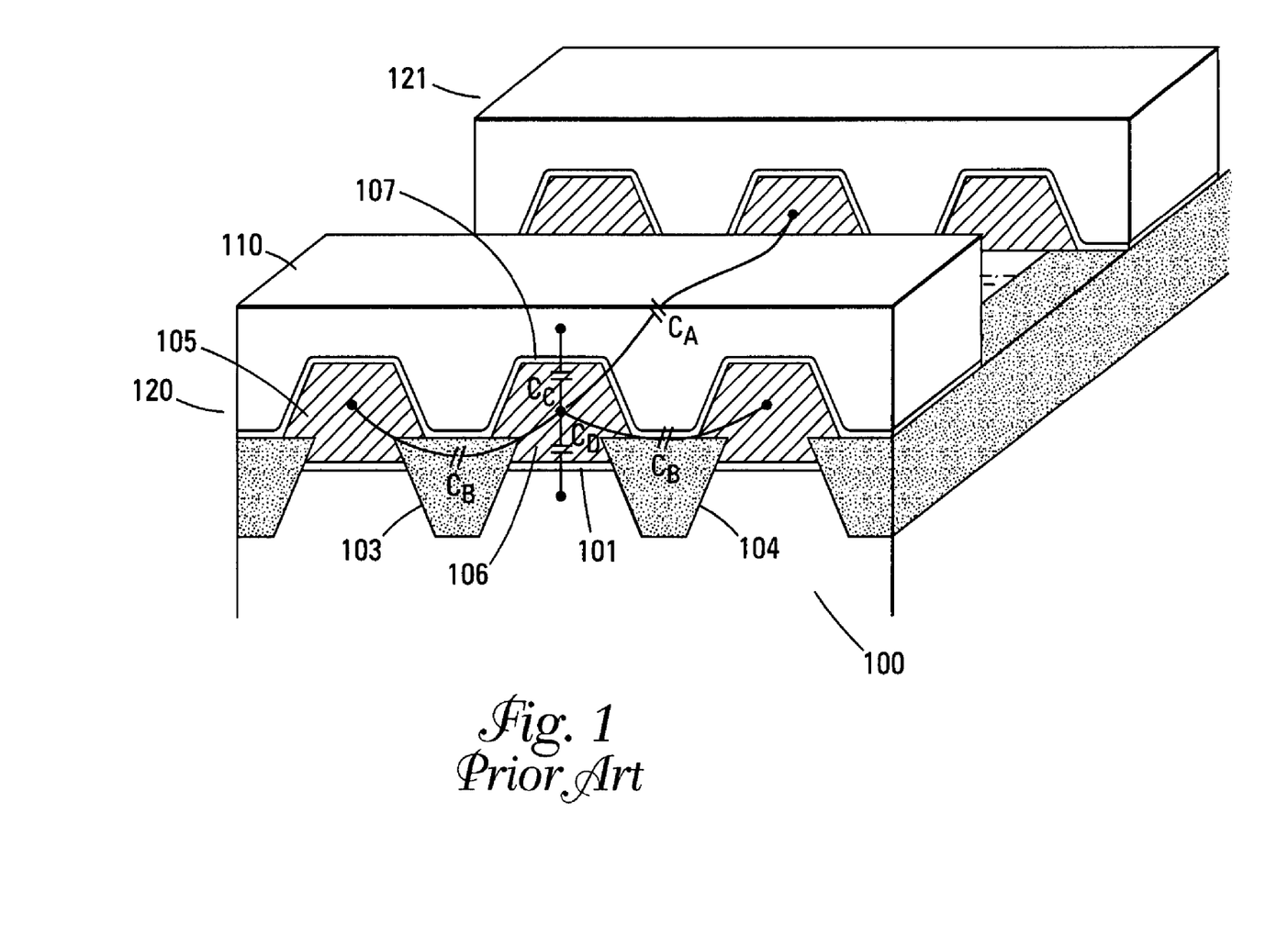
FIG. 1 shows a cross-sectional view, along a wordline, of a typical prior art NAND flash memory cell array.

FIG. 1 illustrates a cross-sectional view of a typical prior art memory cell array. A typical cell is comprised of a silicon substrate 100. A gate insulator layer 101 is formed on top of the substrate 100. Oxide isolation areas 103 and 104 are formed between the cells. The floating gates 105 and 106 are formed between the oxide isolation areas 103 and 104. An interpoly insulator 107 is formed over the floating gates 105 and 106 prior to forming the control gate 110 on top. The memory array is comprised of multiple rows 120 and 121 of memory cell transistors.

The capacitances that couple the various components of the array are illustrated as $C_{A-D}$. $C_A$ is the row-to-row floating gate stray capacitance. $C_B$ is the end-to-end floating gate stray capacitance. $C_C$ is the floating gate-to-control gate coupling capacitance and $C_D$ is the floating gate-to-substrate coupling capacitance.

The ratio of these capacitive components is determined by the geometrical dimensions of the facing surfaces constituting the capacitance and the dielectric constants of the insulator materials. The ends and sides of the floating gates are the plate areas of the stray capacitances. The dielectrics between the side and end areas are the oxide and have the same dielectric constant as the gate oxide. In the case of NAND flash memory devices, the polysilicon floating gate material is thick resulting in large surfaces on the ends and sides of the floating gates. The thick floating gate material results in greater stray capacitances.

For the reasons stated above, and for other reasons stated below which will become apparent to those skilled in the art upon reading and understanding the present specification, there is a need in the art for a flash memory cell transistor that has reduced coupling between floating gates.

SUMMARY

The above-mentioned problems with flash memories and other problems are addressed by the present invention and will be understood by reading and studying the following specification.

The present invention encompasses a non-planar flash memory array comprised of memory cells on mesas. Each memory cell has a floating gate and a control gate coupled to a wordline.

The array comprises a plurality of columns of memory cells are fabricated in multiple planes of a substrate. A plurality of rows of memory cells are fabricated in the multiple planes. The memory cells of each row are coupled through a wordline. A metal layer is formed between and substantially parallel to adjacent wordlines such that the floating gates of adjacent memory cells are shielded.

Further embodiments of the invention include methods and apparatus of varying scope.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including gallium arsenide (GaAs), germanium, carbon, silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

While the subsequently described embodiments are to a NAND flash memory device, the present invention is not limited to such an architecture. For example, using a virtual ground array that is well known in the art, the flash memory array with shielded floating gates can be fabricated in a NOR architecture.

In the NOR configuration, the cells are arranged in a matrix. The control gates of each floating gate memory cell of the array matrix are connected by rows to wordlines and their drains are connected to column bitlines. The source of each floating gate memory cell is typically connected to a common source line. Still other embodiments can use other architectures.

Figure 2:
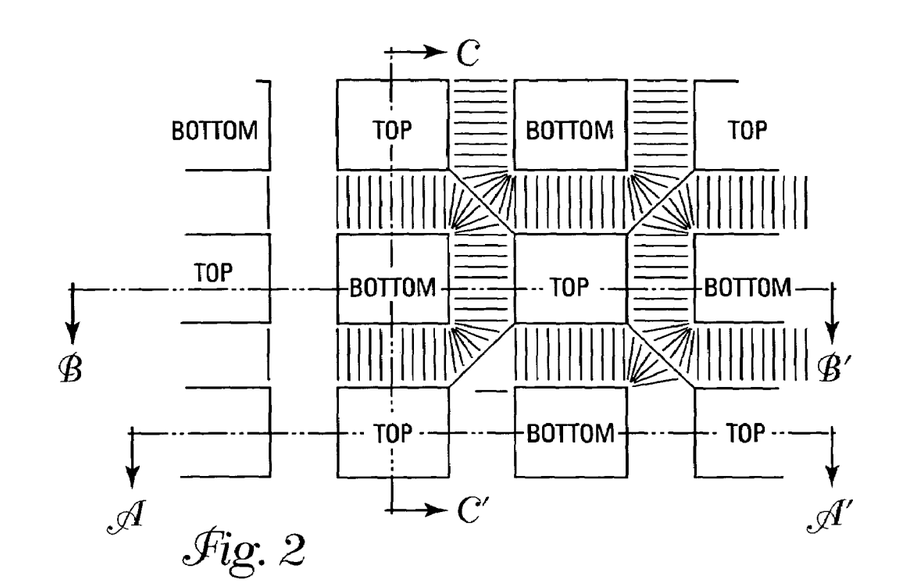
FIG. 2 shows a top view of one embodiment of a flash memory array of the present invention with shielded floating gates on silicon mesas.

FIG. 2 illustrates a top view of one embodiment of a flash memory array of the present invention with shielded floating gates on silicon mesas. The transistors are formed both on the mesas and in adjacent valleys between the mesas. Metal shielding prevents coupling between adjacent floating gates in the same column. Wordlines that connect the rows of the array are formed into the valleys between adjacent columns to prevent coupling between floating gates in the adjacent columns.

Figure 3:
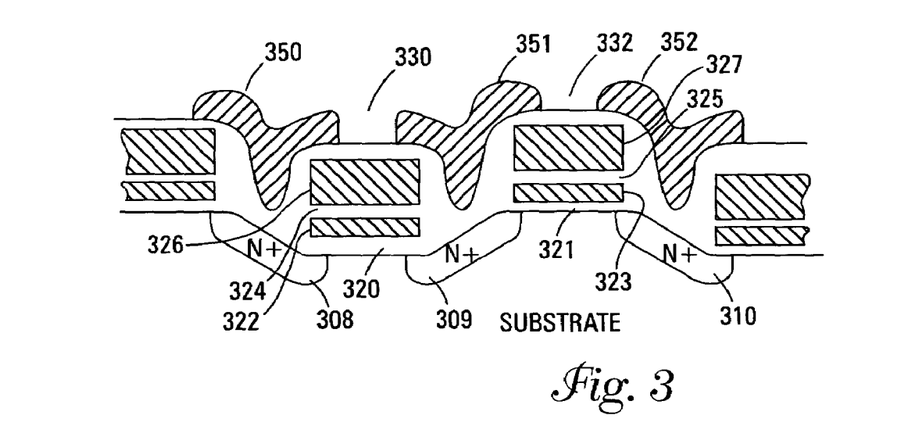
FIG. 3 shows a cross-sectional view along axis A-A' of the embodiment of FIG. 2.
Figure 4:
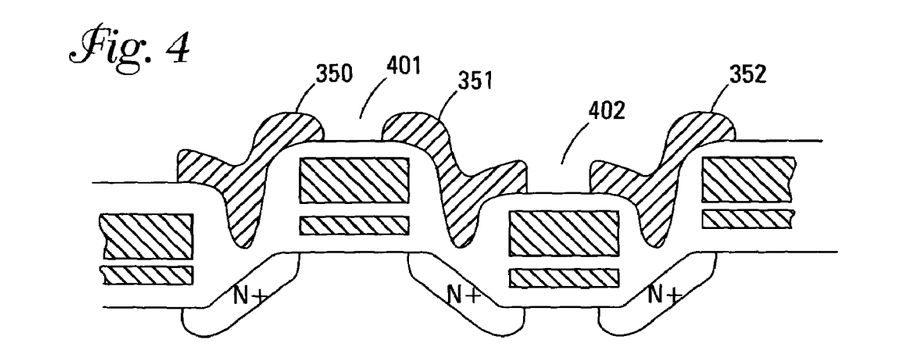
FIG. 4 shows a cross-sectional view along axis B-B' of the embodiment of FIG. 2.
Figure 5:
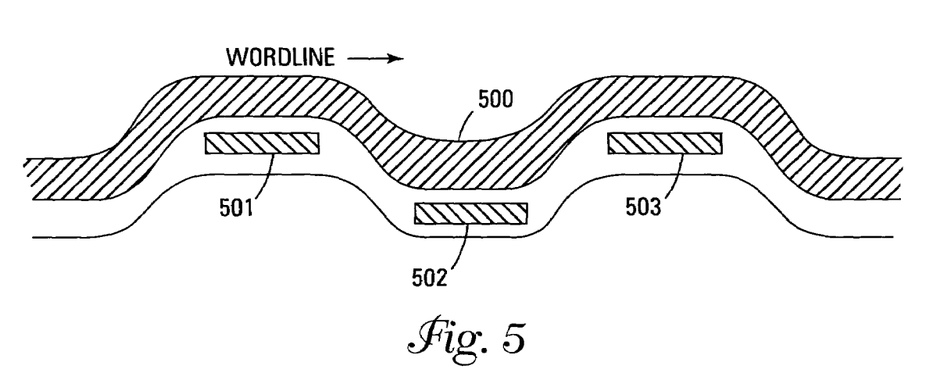
FIG. 5 shows a cross-sectional view along axis C-C' of the embodiment of FIG. 2.

FIG. 2 illustrates cross-sectional axes that are used to show the structures of the present invention. A cross-sectional view along axis A-A' of one embodiment of the present invention is illustrated in FIG. 3. A cross-sectional view along axis B-B' of one embodiment of the present invention is illustrated in FIG. 4. Similarly, a cross-sectional view along axis C-C' of one embodiment of the present invention is illustrated in FIG. 5.

FIG. 3 illustrates a cross-sectional view along axis A-A' of the embodiment of FIG. 2. The memory cells are fabricated on a mesa and valley surface with transistors fabricated both on the mesas and in the valleys. The cells are not vertical structures but are conventional devices with conduction in channels that are parallel to the substrate surface.

The portion of the array illustrated in FIG. 3 is comprised of a column of cells of which two 330 and 332 are discussed. One cell 330 is fabricated in a valley while the other cell 332 is fabricated on a mesa. The cells 332 on the mesas may be considered to be formed on an upper plane of the substrate and the cells 330 in the valleys may be considered to be formed in a lower plane of the substrate.

Source/drain regions 308-310 are doped into the sides of the mesas. These regions 308-310 couple adjacent cells (e.g., cell 330 to 332) of each plane together into columns of a NAND architecture. A channel region exists at the top of each mesa and the bottom of each valley such that, during operation of the cells 330 and 332, a channel forms in the channel region between each pair of source/drain regions 308 and 309 or 309 and 310.

In one embodiment, the source/drain regions 308-310 are n+ regions that are doped into a p-type substrate. However, the source/drain regions and substrate of the present invention are not limited to any one conductivity type.

Gate insulator layers 320 and 321 are formed over the channel regions and between the source/drain regions 308 and 309 or 309 and 310. Floating gates 322 and 323 are formed over the gate insulators 320 and 321. In one embodiment, these are polysilicon floating gates. Alternate embodiments may use nitride or other types of charge storage layers.

Intergate insulator layers 324 and 325 are formed over the floating gate layers 322 and 323 respectively. Control gates 326 and 327 are formed over the intergate insulators 324 and 325 respectively. The control gates 326 and 327 are coupled to, or are part of, the wordlines of the memory array as illustrated in subsequent figures showing different cross-sectional areas. The wordlines couple the rows of the array by following the mesa/valley structure.

For shielding purposes, a metal layer 350-352 is formed between adjacent wordlines in a column of cells of the memory array. The metal 350-352 extends along the rows substantially parallel to the wordlines to shield the floating gates 322 and 323 of the adjacent cells 330 and 332. The metal 350-352 is formed deep enough into the structure such that the floating gates on the mesas are shielded from the lower floating gates in the valleys. The metal shields can be formed after oxidation of the wordlines and by a metal deposition process.

The gate insulator layer and intergate insulator layer between the polysilicon gates, as illustrated in FIG. 3, can be high-k dielectrics (i.e., dielectric constant greater than that of $SiO_2$), composite insulators, silicon oxide, or some other insulator. Silicon dioxide ($SiO_2$) is an insulator with a relative dielectric constant of 3.9. A high-k gate insulator requires smaller write and erase voltages due to the reduced thickness layer between the control gate and the floating gate. These dielectric layers may be formed by atomic layer deposition (ALD), evaporation, or some other fabrication technique.

As is well known in the art, ALD is based on the sequential deposition of individual monolayers or fractions of a monolayer in a well-controlled manner. Gaseous precursors are introduced one at a time to the substrate surface and between the pulses the reactor is purged with an inert gas or evacuated.

In the first reaction step, the precursor is saturatively chemisorbed at the substrate surface and during subsequent purging the precursor is removed from the reactor. In the second step, another precursor is introduced on the substrate and the desired films growth reaction takes place. After that reaction, byproducts and the precursor excess are purged from the reactor. When the precursor chemistry is favorable, one ALD cycle can be performed in less than one second in a properly designed flow-type reactor. The most commonly used oxygen source materials for ALD are water, hydrogen peroxide, and ozone. Alcohols, oxygen and nitrous oxide can also been used.

ALD is well suited for deposition of high-k dielectrics such as $AlO_x$, $LaAlO_3$, $HfAlO_3$, $Pr_2O_3$, Lanthanide-doped $TiO_x$, HfSiON, Zr—Sn—Ti—O films using $TiCl_4$ or $TiI_4$, ZrON, $HfO_2$/Hf, $ZrAl_xO_y$, $CrTiO_3$, and $ZrTiO_4$.

The dielectric layers of the present invention can also be formed by evaporation. Dielectric materials formed by evaporation can include: $TiO_2$, $HfO_2$, $CrTiO_3$, $ZrO_2$, $Y_2O_3$, $Gd_2O_3$, $PrO_2$, $ZrO_xN_y$, Y—Si—O, and $LaAlO_3$.

Very thin films of $TiO_2$ can be fabricated with electron-gun evaporation from a high purity $TiO_2$ slug (e.g., 99.9999%) in a vacuum evaporator in the presence of an ion beam. In one embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated $TiO_2$ film. An ion gun with a fairly large diameter (3-4 in. in diameter) is located above the electron gun and argon gas is used to generate Ar ions to bombard the substrate surface uniformly during the film deposition to compact the growing $TiO_2$ film.

A two-step process is used in fabricating a high purity $HfO_2$ film. This method avoids the damage to the silicon surface by Ar ion bombardment, such as that encountered during Hf metal deposition using dc sputtering. A thin Hf film is deposited by simple thermal evaporation. In one embodiment, this is by electron-beam evaporation using a high purity Hf metal slug (e.g., 99.9999%) at a low substrate temperature (e.g., 150°-200° C.). Since there is no plasma and ion bombardment of the substrate (as in the case of sputtering), the original atomically smooth surface of the silicon substrate is maintained. The second step is oxidation to form the desired $HfO_2$.

The first step in the deposition of CoTi alloy film is by thermal evaporation. The second step is the low temperature oxidation of the CoTi film at 400° C. Electron beam deposition of the CoTi layer minimizes the effect of contamination during deposition. The CoTi films prepared from an electron gun possess the highest purity because of the high-purity starting material. The purity of zone-refined starting metals can be as high as 99.999%. Higher purity can be obtained in deposited films because of further purification during evaporation.

A two-step process in fabricating a high-purity $ZrO_2$ film avoids the damage to the silicon surface by Ar ion bombardment. A thin Zr film is deposited by simple thermal evaporation. In one embodiment, this is accomplished by electron beam evaporation using an ultra-high purity Zr metal slug (e.g., 99.9999%) at a low substrate temperature (e.g., 150°-200° C.). Since there is no plasma and ion bombardment of the substrate, the original atomically smooth surface of the silicon substrate is maintained. The second step is the oxidation to form the desired $ZrO_2$.

The fabrication of $Y_2O_3$ and $Gd_2O_3$ films may be accomplished with a two-step process. In one embodiment, an electron gun provides evaporation of high purity (e.g., 99.9999%) Y or Gd metal followed by low-temperature oxidation technology by microwave excitation in a $Kr/O_2$ mixed high-density plasma at 400° C. The method of the present invention avoids damage to the silicon surface by Ar ion bombardment such as that encountered during Y or Gd metal deposition sputtering. A thin film of Y or Gd is deposited by thermal evaporation. In one embodiment, an electron-beam evaporation technique is used with an ultra-high purity Y or Gd metal slug at a low substrate temperature (e.g., 150°-200° C.). Since there is no plasma or ion bombardment of the substrate, the original atomically smooth surface of the silicon substrate is maintained. The second step is the oxidation to form the desired $Y_2O_3$ or $Gd_2O_3$.

The desired high purity of a $PrO_2$ film can be accomplished by depositing a thin film by simple thermal evaporation. In one embodiment, this is accomplished by an electron-beam evaporation technique using an ultra-high purity Pr metal slug at a low substrate temperature (e.g., 150°-200° C.). Since there is no plasma and ion bombardment of the substrate, the original atomically smooth surface of the silicon substrate is maintained. The second step includes the oxidation to form the desired $PrO_2$.

The nitridation of the $ZrO_2$ samples comes after the low-temperature oxygen radical generated in high-density Krypton plasma. The next step is the nitridation of the samples at temperatures >700° C. in a rapid thermal annealing setup. Typical heating time of several minutes may be necessary, depending on the sample geometry.

The formation of a Y—Si—O film may be accomplished in one step by co-evaporation of the metal (Y) and silicon dioxide ($SiO_2$) without consuming the substrate Si. Under a suitable substrate and two-source arrangement, yttrium is evaporated from one source, and $SiO_2$ is from another source. A small oxygen leak may help reduce the oxygen deficiency in the film. The evaporation pressure ratio rates can be adjusted easily to adjust the Y—Si—O ratio.

The prior art fabrication of lanthanum aluminate ($LaAlO_3$) films has been achieved by evaporating single crystal pellets on Si substrates in a vacuum using an electron-beam gun. The evaporation technique of the present invention uses a less expensive form of dry pellets of $Al_2O_3$ and $La_2O_3$ using two electron guns with two rate monitors. Each of the two rate monitors is set to control the composition. The composition of the film, however, can be shifted toward the $Al_2O_3$ or $La_2O_3$ side depending upon the choice of dielectric constant. After deposition, the wafer is annealed ex situ in an electric furnace at 700° C. for ten minutes in $N_2$ ambience. In an alternate embodiment, the wafer is annealed at 800°-900° C. in RTA for ten to fifteen seconds in $N_2$ ambience.

The above described ALD and evaporation techniques are for purposes of illustration only. The embodiments of the present invention are not limited to any one dielectric material or dielectric fabrication technique.

FIG. 4 illustrates the cross-sectional view along axis B-B' of FIG. 2. This view is parallel to the view of FIG. 3 and thus shows a memory array column that is adjacent to the column of FIG. 3. The metal shields 350-352 extend between and substantially parallel to the wordlines and perpendicular to the columns. This view also shows the alternating plane nature of the cells 401 and 402 in that a cell that is in the upper plane in a first column of the substrate is adjacent to a cell in the lower plane in an adjacent column.

The shape and size of the metal shields illustrated in FIGS. 3 and 4 are for purposes of illustration only. The present invention is not limited to any one size or shape of metal shield.

FIG. 5 illustrates the cross-sectional view along axis C-C' of FIG. 2. This view is perpendicular to the views of FIGS. 3 and 4. This view shows the wordline 500 rows of the memory array. It can be seen that the control gates of FIGS.

3 and 4 are formed into the wordlines 500 that extend parallel with the metal shields.

The mesa/valley construction and the wordlines provide shielding for adjacent memory cells in a row. As a wordline that connects a row of memory cells slopes up and down through the mesas and valleys, it provides shielding between adjacent floating gates along that wordline.

Figure 6:
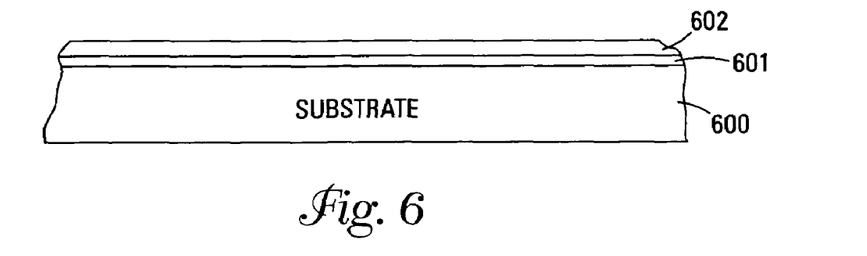
FIG. 6 shows a cross-sectional view of fabrication steps for one embodiment of the present invention in accordance with the array of FIG. 2.

FIG. 6 illustrates an embodiment for fabricating the non-planar flash memory array of FIG. 2. An oxide layer 601 and a nitride mask layer 602 are formed over the substrate 600. The nitride mask 602 is patterned and etched to produce the embodiment of FIG. 7.

Figure 7:
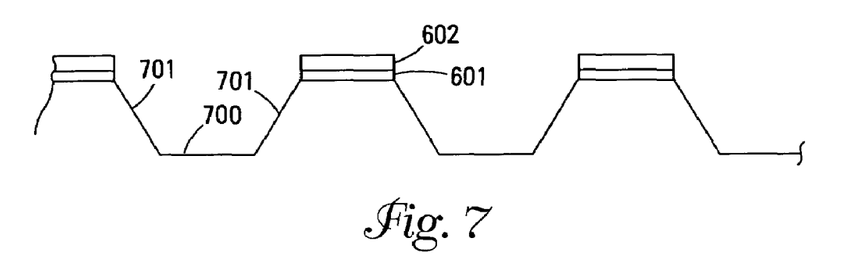
FIG. 7 shows a cross-sectional view of additional steps for one embodiment of the fabrication method of the present invention in accordance with the array of FIG. 2.

An anisotropic etch process is used to form the mesa/valley structure of FIG. 7 that leaves portions of the nitride mask 602 and oxide layer 601 on the mesas. The anisotropic etch process, in one embodiment, uses a potassium hydroxide (KOH) etch that is highly directional. The KOH etch etches the lower plane 700 of the valley very fast while etching the side planes 701 of the valley at a much slower rate. This directional etching produces the mesas and valley structure.

Figure 8:
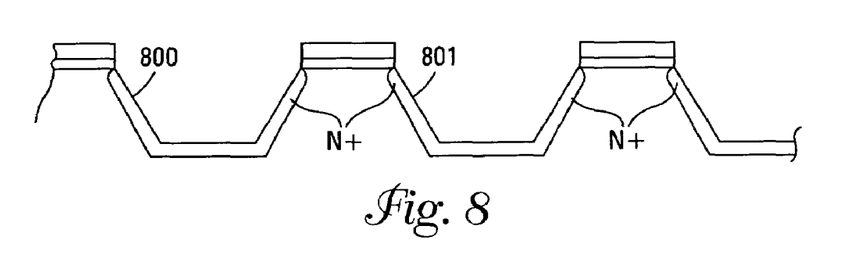
FIG. 8 shows a cross-sectional view of additional steps for one embodiment of the fabrication method of the present invention in accordance with the array of FIG. 2.

An implantation process, illustrated in FIG. 8, lines the valleys with n+ doped regions 800 and 801. The etch process is continued to remove the lowest levels of the valley structure to produce the cross-sectional view of FIG. 9 where the lower portions 900 and 901 of the valley have been etched through to remove the lowest doped regions. The dotted lines indicate the previous valley floors as illustrated in FIG. 8. This etch step leaves the sidewalls of the valley with the n+ doped source/drain regions. In one embodiment, this etch process is also a KOH anisotropic etch.

Figure 9:
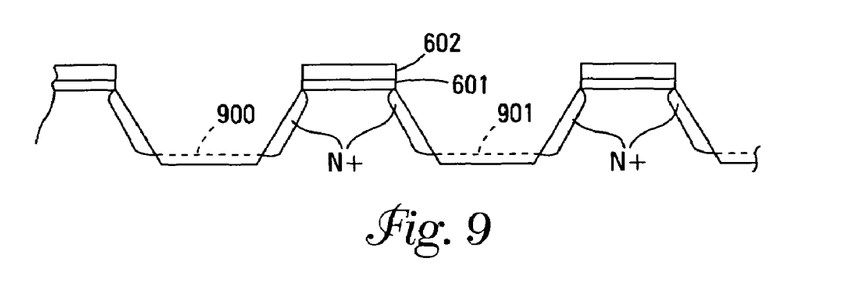
FIG. 9 shows a cross-sectional view of additional steps for one embodiment of the fabrication method of the present invention in accordance with the array of FIG. 2.
Figure 10:
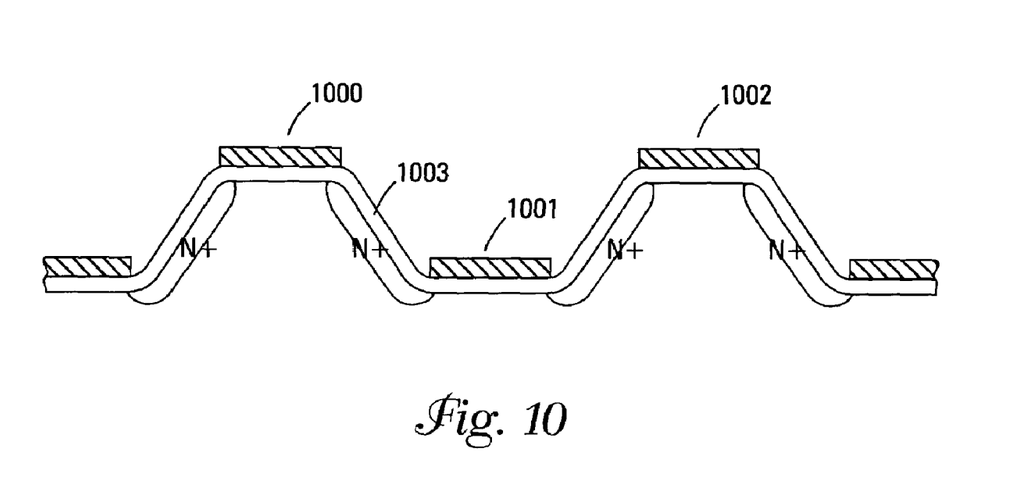
FIG. 10 shows a cross-sectional view of additional steps for one embodiment of the fabrication method of the present invention in accordance with the array of FIG. 2.

FIG. 10 illustrates that the nitride mask layer 602 and oxide layer 601 are removed from FIG. 9 in another etch process. The substrate is heat treated to diffuse the source/drain regions. An oxide layer 1003 is formed over the mesa/valley structures in order to form the gate oxide layer 1003.

A polysilicon layer is deposited over the gate oxide layer 1003. This layer is patterned and etched to form the floating gates 1000-1002 of the memory cells.

The process can then continue with conventional processing to form the remaining portions of the memory array. For example, the complete structure may be filled with a deposited oxide and planarized by chemical mechanical polishing (CMP). The polysilicon floating gates can be oxidized or an intergate insulator deposited and the polysilicon control gates and wordlines deposited and separated by masking and an etch process.

The wordlines can be oxidized or covered with a deposited insulator layer and the metal shield layers deposited and patterned between the wordlines in order to achieve the structure illustrated in FIGS. 2-5. Metallization for contacts can be accomplished using techniques that are well known in the art.

In operation, the stepped, non-planar flash memory devices of the present invention can be programmed with tunnel injection using positive gate voltages with respect to the substrate/p-well. In another embodiment, channel hot electron injection can be used in a programming operation. This is accomplished by applying a positive drain voltage (e.g., +6 to +9V) to a first source/drain region, a positive voltage to the control gate (e.g., +12V) and grounding the second source/drain region to create a hot electron injection into the gate insulator of the charge storage region.

An alternate embodiment programming operation uses substrate enhanced hot electron injection (SEHE). In this embodiment, a negative substrate bias is applied to the p-type substrate. This bias increases the surface lateral field near a source/drain region thus increasing the number of hot electrons. The benefit of such an embodiment is that a lower drain voltage is required during programming operations. In one embodiment, the negative substrate bias is in the range of 0V to −3V. Alternate embodiments may use other voltage ranges.

For an erase operation, one embodiment uses tunneling with conventional negative gate voltages with respect to the substrate/p-well. In another embodiment, the control gate is grounded, the drain connection is left floating and the source region has a positive voltage applied (e.g., +12V). Alternate embodiments for erase operations can use other methods such as substrate enhanced band-to-band tunneling induced hot hole injection (SEBBHH) that are well known in the art.

Figure 11:
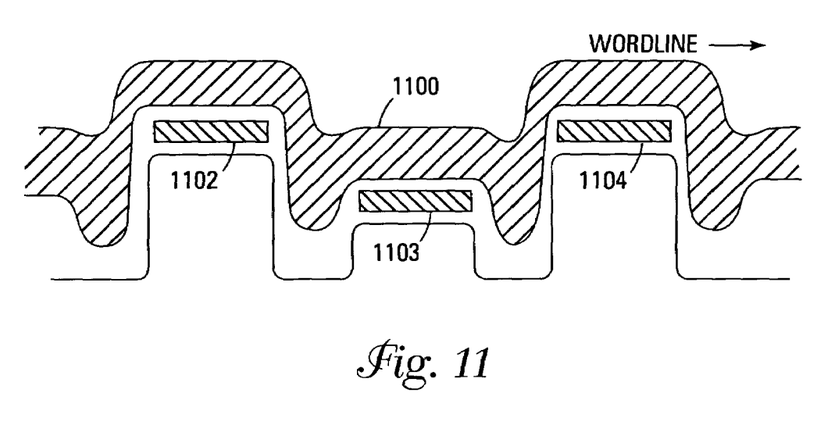
FIG. 11 shows a cross-sectional view of an alternate embodiment of the flash memory array of the present invention.

FIG. 11 illustrates an alternate embodiment of the flash memory array of the present invention. This embodiment uses alternating pillars and trenches to shield the adjacent floating gates 1102-1104. A row of the memory array is connected in series by a wordline 1100 that is formed into the trenches. The wordline provides shielding between adjacent floating gates due to the wordline flowing over the pillars and down into the trenches.

Figure 12:
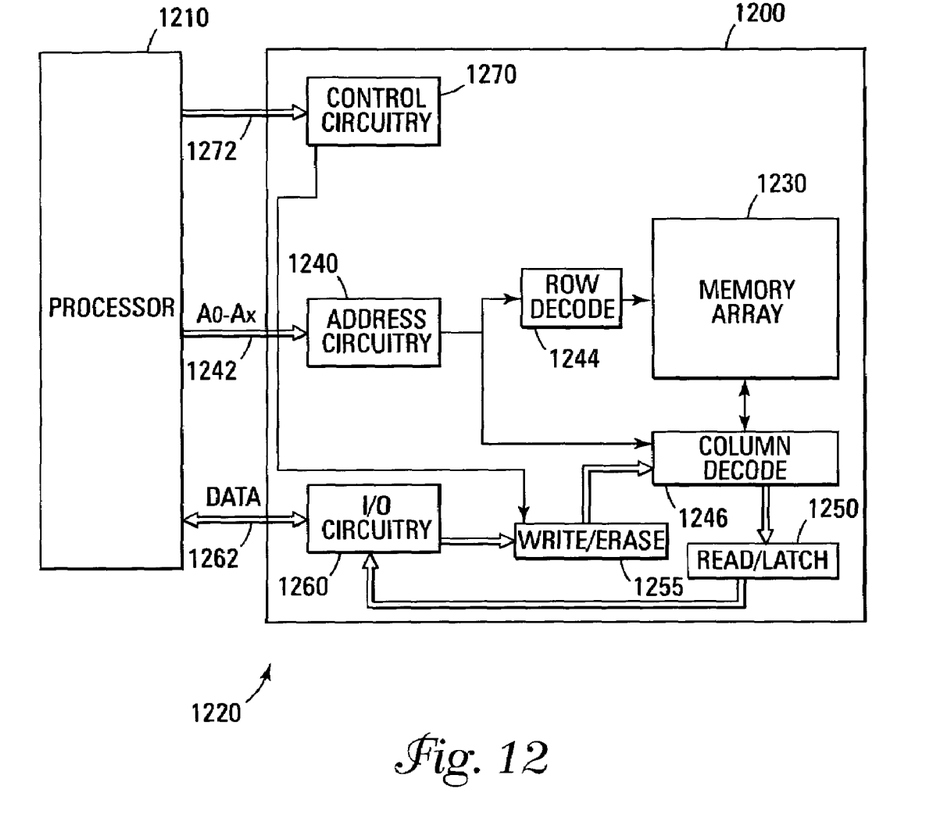
FIG. 12 shows a block diagram of an electronic system of the present invention that incorporates the memory array of FIG. 2.

FIG. 12 illustrates a functional block diagram of a memory device 1200 that can incorporate the flash memory array of the present invention with shielded floating gates on silicon mesas. The memory device 1200 is coupled to a processor 1210. The processor 1210 may be a microprocessor or some other type of controlling circuitry. The memory device 1200 and the processor 1210 form part of an electronic system 1220. The memory device 1200 has been simplified to focus on features of the memory that are helpful in understanding the present invention.

The memory device includes an array of flash memory cells 1230 that can be comprised of the non-planar flash memory cells with shielded floating gates as described previously. The memory array 1230 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 1240 is provided to latch address signals provided on address input connections A0-Ax 1242. Address signals are received and decoded by a row decoder 1244 and a column decoder 1246 to access the memory array 1230. It will be appreciated by those skilled in the art, with the benefit of the present description, that the number of address input connections depends on the density and architecture of the memory array 1230. That is, the number of addresses increases with both increased memory cell counts and increased bank and block counts.

The memory device 1200 reads data in the memory array 1230 by sensing voltage or current changes in the memory array columns using sense/buffer circuitry 1250. The sense/buffer circuitry, in one embodiment, is coupled to read and latch a row of data from the memory array 1230. Data input and output buffer circuitry 1260 is included for bi-directional data communication over a plurality of data connections 1262 with the controller 1210. Write circuitry 1255 is provided to write data to the memory array.

Control circuitry 1270 decodes signals provided on control connections 1272 from the processor 1210. These signals are used to control the operations on the memory array 1230, including data read, data write (program), and erase operations. The control circuitry 1270 may be a state machine, a sequencer, or some other type of controller.

The flash memory device illustrated in FIG. 12 has been simplified to facilitate a basic understanding of the features of the memory. A more detailed understanding of internal circuitry and functions of flash memories are known to those skilled in the art.

CONCLUSION

In summary, the flash memory array of the present invention utilizes non-planar memory cells on silicon mesas that have shielded floating gates to reduce coupling capacitance between cells while increasing memory density. Adjacent rows of floating gates are shielded by metal layers that are formed between and substantially parallel to adjacent wordlines on different planes. Adjacent columns of floating gates are shielded by the wordlines that are formed down into the valleys along the mesa/valley construction.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating a non-planar flash memory array, with shielded floating gates, comprising a plurality of memory cells, the method comprising:

forming a mesa/valley structure, comprising a plurality of mesas and valleys, in a substrate;

forming source/drain regions along sidewalls of the mesas between the tops of the mesas and the valleys;

forming a gate insulator layer over the substrate;

depositing a first polysilicon layer;

etching the polysilicon to form a single floating gate in each valley and a single floating gate on top of each mesa;

forming an intergate insulator layer over the floating gates;

forming a second polysilicon layer over the integrate insulator and removing a portion of the second polysilicon layer to produce wordlines; and forming a metal layer between and substantially parallel to the wordlines to shield the floating gates.

2. The method of claim 1 wherein forming the mesa/valley structure comprises directionally etching the substrate with an anisotropic etch process.

3. The method of claim 1 wherein forming source/drain regions comprises:

doping the valleys; and directionally etching the doped valleys to remove enough of valley floors to leave the source/drain regions in valley sidewalls.

4. The method of claim 2 wherein the anisotropic etch process uses potassium hydroxide.

5. The method of claim 1 wherein the gate insulator layer is formed by deposition.

6. The method of claim 1 wherein the intergate insulator layer is formed by oxidation of the floating gates.

7. The method of claim 1 wherein the intergate insulator layer is formed by deposition.

8. The method of claim 1 wherein the gate insulator layer and the intergate insulator layer are high-k dielectric materials that are formed by atomic layer deposition and are comprised of one of: $AlO_x$, $LaAlO_3$, $HfAlO_3$, $Pr_2O_3$, Lanthanide-doped $TiO_x$, HfSiON, Zr—Sn—Ti—O films using $TiCl_4$ or $TiI_4$, ZrON, $HfO_2/Hf$, $ZrAl_xO_y$, $CrTiO_3$, or $ZrTiO_4$.

9. The method of claim 1 wherein the gate insulator layer and the intergate insulator layer are high-k dielectric material that are formed by evaporation and are comprised of one of: $TiO_2$, $HfO_2$, $CrTiO_3$, $ZrO_2$, $Y_2O_3$, $Gd_2O_3$, $PrO_2$, $ZrO_xN_y$, Y—Si—O, or $LaAlO_3$.

10. The method of claim 1 wherein the gate insulator layer and the intergate insulator layer are composite insulators.

11. The method of claim 1 wherein the gate insulator layer and the intergate insulator layer are silicon oxide.

12. A method for fabricating a non-planar flash memory array comprising a plurality of memory cells with shielded floating gates, the method comprising:

directionally etching a substrate to form a first plurality of trenches to a first depth, each pair of trenches forming a pillar;

forming source/drain regions along the sidewalls of the trenches;

forming a gate insulator layer over the substrate;

depositing a floating gate layer;

etching the floating gate layer to form a single floating gate in each trench and a single floating gate on each pillar;

etching a second plurality of trenches in the substrate in a direction that is substantially perpendicular to the first plurality of trenches, the second plurality of trenches etched to a second depth in the substrate that is greater than the first depth;

forming an intergate insulator layer over the floating gates;

forming a wordline over the intergate insulator to connect memory cells in each row of the array such that the wordline extends down into the second plurality of trenches to shield floating gates in the first plurality of trenches from adjacent floating gates across the second plurality of trenches and to shield floating gates on pillars from adjacent floating gates on pillars across the second plurality of trenches;

forming a metal shield along the first plurality of trenches to shield floating gates on pillars from adjacent floating gates on pillars across the first plurality of trenches; and performing a metallization process for contacts.

13. The method of claim 12 wherein the source/drain regions are n+ doped regions and the substrate is a p-type silicon.

14. The method of claim 12 wherein directionally etching the substrate comprises an anisotropic potassium hydroxide etch process.

15. The method of claim 12 wherein, prior to directionally etching the substrate, the method further includes depositing a nitride mask layer and an oxide layer on the substrate and the nitride mask layer is patterned.

* * * * *

UNITED STATES PATENT AND TRADEMARK OFFICE
CERTIFICATE OF CORRECTION

PATENT NO. : 7,339,228 B2
APPLICATION NO. : 11/363730
DATED : March 4, 2008
INVENTOR(S) : Forbes et al.

It is certified that error appears in the above-identified patent and that said Letters Patent is hereby corrected as shown below:

In column 9, line 45, in Claim 1, delete "integrate" and insert -- intergate --, therefor.

In column 9, line 48, in Claim 1, after "layer" insert -- on --.

Signed and Sealed this

Seventeenth Day of June, 2008

JON W. DUDAS
*Director of the United States Patent and Trademark Office*